United States Patent [19]

Aichelmann, Jr.

[11] 4,238,842

[45] Dec. 9, 1980

[54] LARAM MEMORY WITH REORDERED SELECTION SEQUENCE FOR REFRESH

[75] Inventor: Frederick J. Aichelmann, Jr., Hopewell Junction, N.Y.

[73] Assignee: IBM Corporation, Hopewell Junction, N.Y.

[21] Appl. No.: 973,294

[22] Filed: Dec. 26, 1978

[51] Int. Cl.³ .............................................. G11C 8/00
[52] U.S. Cl. .................................................. 365/222
[58] Field of Search ....................................... 365/222

[56] References Cited

U.S. PATENT DOCUMENTS

| 4,084,154 | 4/1978 | Panigrahi | 365/222 |
| 4,112,513 | 9/1978 | Elsner | 365/222 |

OTHER PUBLICATIONS

Barsuhn et al., Refresh System for Dynamic Hierarchy Storages, IBM Tech. Disc. Bul., vol. 16, No. 4, 9/73, p. 1074.

*Primary Examiner*—Stuart N. Hecker

*Attorney, Agent, or Firm*—Sughrue, Rothwell, Mion, Zinn and Macpeak

[57] ABSTRACT

A computer paging store memory utilizing line addressable random access memories (LARAM) including charge coupled device (CCD) shift registers in which data is read out of the memory for utilization in a block storage memory without loss of refresh time due to the refresh of individual CCD shift registers. The memory is organized as a number of parallel-connected memory storage units, each of which includes a separate interface logic, a refresh control and a number of memory array units, each of which in turn is constructed of LARAM devices, each of which must be refreshed within a predetermined time interval. Data is normally read out from the LARAM devices one at a time in sequence. During the readout operation, a detection is continuously made which determines whether the next LARAM device in sequence must be refreshed during the subsequent readout time period. If a refresh operation is required, the selection sequence is reordered enabling the refreshing operation to occur while the data transfer comes from another element.

27 Claims, 9 Drawing Figures

FIG. 4A - MEMORY SEGMENT
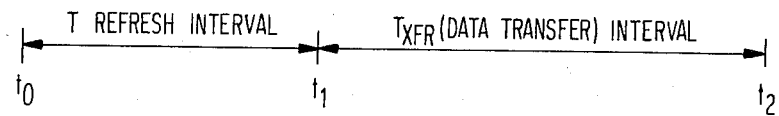
FIG. 4B - SYSTEM OR BLOCK TRANSFER INTERVAL WITHOUT REFRESH
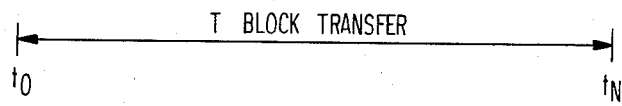
FIG. 4C - BLOCK TRANSFER WITH REFRESH
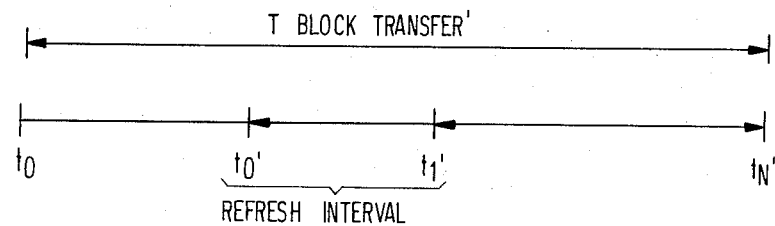
FIG. 4D - DISTRIBUTED DATA SEGMENTS
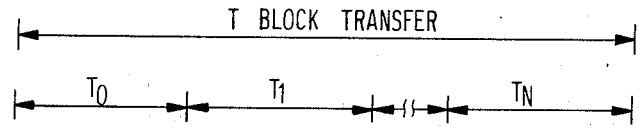
FIG. 4E - OFFSET SELECTION TO NEW ORIGIN TO AVOID REFRESH
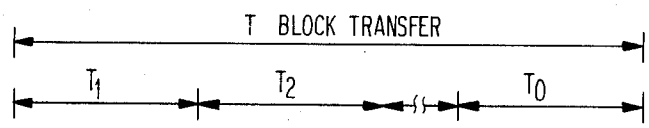

LARAM MEMORY WITH REORDERED SELECTION SEQUENCE FOR REFRESH

BACKGROUND OF THE INVENTION

1. Field of the Invention

The invention pertains to computer memory systems which require refresh at predetermined time intervals in order to provide for data retention. In particular, the invention pertains to the use of CCD memories such as in a LARAM device used in a paging store memory application.

2. Description of the Prior Art

CCD's for computer memory purposes have recently become available. The basic charge coupled memory device is a shift register which is constructed as a line of capacitive storage elements which have the ability to pass stored charges from one storage position to the next under the control of a clock signal. As the storage elements are basically capacitive in nature and subject to leakage, it is necessary that the data in each shift register be recirculated or refreshed within a predetermined time interval less the data stored therein be lost.

More recently, multiple CCD shift registers have become available upon a single semiconductor chip. Various organizations have been proposed but the line addressable random access memory (LARAM) structure has been one of the most promising. One such device is described in U.S. Pat. No. 4,024,512, issued on May 17, 1977, to Amelio et al. Therein, a LARAM device structure is described which includes a number of parallel shift registers each of which is coupled to common output and common input buses. Separate address activation or selection lines are provided for selecting or activating a predetermined one of the shift registers within a single device. To read data into a selected shift register, the corresponding address or selection line is activated and the data read in through an input buffer onto the input bus under control of a clock signal and internal control logic. To read the data out, the corresponding address or select line is again activated and a clock signal applied. The data from the selected shift register is then read out upon the output bus through a charge sense amplifier and finally through an output buffer to an data output line. Similarly, to refresh a particular shift register, the corresponding address or select line is activated, the clocking signal applied and the data read out upon the output bus through the charge sense amplifier and then through a regeneration loop back through the control logic and input buffer onto the input bus and back into the same shift register. Because only a single charge sense amplifier is provided for each loop of shift registers, each shift register must be refreshed separately from all the rest and at a different time interval. Also, it is not possible to read data out from one shift register while another shift register in the same LARAM chip is being refreshed.

In medium- and large-scale computer systems, charge coupled device memories have been proposed in a number of configurations for filling a gap between low-speed, low-cost disc memories and high-speed, high-cost random access memories. However, CCD memories have not heretobefore fulfilled their entire potential because of the refresh problem. That is, a significant amount of time must be taken to refresh the devices which adds to the total time required to read data from memory employing these devices.

One memory system in which CCD's can be used to advantage is termed the paging store-type memory. In the organization of this memory, a number of parallel-operated memory storage units are provided, all of which connect to a controller through common data, address and control buses. Each memory storage unit, in turn, includes plural memory array units each of which may store a single block or more of data. For the entire set of memory array units within a single memory storage unit, there is provided a single interface logic circuit including an array timing circuit and also a refresh control circuit. Data is always read out from the memory storage units one block at a time. A data block of 4,096 (4 K) bytes of 9 bits each is typical.

Within each memory storage unit, the interface logic circuit, array timing and refresh control circuits determine how data is stored among the various memory array units and control its readout as well as controlling the refresh operation of the memory array units, independent of the read-in and readout of data from the controller. Each memory array unit may include a plurality of shift register elements each of which contains a part of the data. A block of data may begin in any location in one memory array unit and continue on through one or more further memory array units.

SUMMARY OF THE INVENTION

It is an object of the present invention to provide a LARAM memory structure for use in a paging memory application which does not lose readout time due to the necessary refresh operation of data contained and stored within the shift registers of the individual memory array units.

It is a further object of the present invention to provide a paging memory structure which can use existing LARAM chip devices yet which achieves a significant savings in readout time.

These, as well as other objects of the invention, may be met by a computer system memory storage unit which includes a plurality of ordered memory array units, each of which stores a plurality of bits of data within ordered memory elements in which each element requires refresh within a predetermined time interval, means for refreshing the memory array units in a predetermined fixed sequence so as to refresh each of the memory elements within the predetermined time interval, means for reading out data stored in the memory array units without an increase in readout time due to refreshing of the memory array units. The reading out means may include means for determining whether a refresh operation is to be performed on a memory array element during the time period during which the next readout operation is to be performed, and means for reading out data from another memory array element while said first memory array element is being refreshed. The readout means may further include means for reading out data from the refreshed memory array element after data has been read out from the other second memory array element. Each of the memory elements may include at least one shift register and preferably a CCD shift register. The memory array units are each a LARAM unit.

More specifically, a computer system storage memory system in accordance with the invention can be constructed with a plurality of ordered memory array units each of which stores a plurality of bits of data within ordered memory elements and each of which requires refresh within a predetermined time interval, means for refreshing the memory array elements within a predetermined fixed sequence so as to refresh each of the memory elements within the required predetermined time interval, means for storing addresses each of which represents a memory array unit, means for producing a sequence of digital numbers each of which represents a memory array unit to be refreshed, means for comparing the addresses and the numbers of the sequence of numbers to produce a control signal which is in an active state when the address and the numbers of the sequence both represent the same memory array unit, and means for producing the addresses, the addresses being produced in a first predetermined order when the control signal is in the inactive state and in a predetermined second order when the control signal is in the active state. The addresses are produced in the order corresponding to the ordering of the memory array elements when the control signal is in the inactive state. When, however, the control signal is in the active state, the address sequence is reordered. This reordering results in starting with a memory element which was to be selected at a different interval, namely, the memory element which had a refresh required. This enables the memory element requiring refresh to transfer data prior to the refresh interval and then complete the refresh while another element is selected for data transfer. Alternatively, when the first memory element in sequence has the refresh, it is initially skipped and transfers its data at the end of the sequence interval. The memory elements preferably each include at least one shift register such as a CCD register. Each of the memory array units may be a LARAM or any kind of dynamic random access memory which requires refresh.

Further in accordance with the invention, a computer memory system can be constructed including a first memory for storing simultaneously a block of data of predetermined size, a second memory for storing simultaneously a plurality of blocks of data of the same predetermined size, wherein the second memory includes a plurality of memory storage units each of which has a plurality of memory array units which in turn have a plurality of memory elements requiring refresh within a predetermined time interval, and means for transferring data from the second memory to the first memory including means for reading data out of the memory array units without an increase in readout time due to refreshing of the memory array units. This is accomplished by reordering the readout sequence. This reordering results in starting with a memory element which was to be selected at a different interval, namely, the memory element which had a refresh required. This enables the memory element requiring refresh to transfer data prior to the refresh interval and then complete the refresh while another element is selected for data transfer. Alternatively, when the first memory element in sequence has the refresh, it is initially skipped and transfers its data at the end of the sequence interval. Alternatively, the readout means may include means for determining whether a memory element is to be refreshed during a predetermined or subsequent time interval and means for reading out data from the memory elements in a predetermined sequence until a memory element is encountered which is to be refreshed during the next subsequent time interval at which time data from another memory element within the same memory storage unit is read out. The other memory element is the next memory element in sequence. The data from the memory element which is refreshed is read out after the data is read out from the next memory element in sequence.

The invention can also be practiced by a method for transferring blocks of data of predetermined size to a first memory from a second memory having a plurality of memory elements which are refreshed at predetermined time intervals, including the steps of reading data out of the memory elements in a predetermined sequence while simultaneously determining whether the next memory element in sequence is to be refreshed during the next subsequent readout time interval, skipping reading out data from a memory element which is to be refreshed during that time interval, reading out data from another memory element during this interval, and reading data out from the skipped memory element after its refresh has been completed after this time interval.

The invention can still further be practiced by a method of first determining whether a refresh operation will be required among a plurality of memory elements from which data is to be read during a predetermined readout interval. If no refresh is required, the data is read out from the memory elements in a first sequence. However, if a refresh will be required, the sequence is reordered and the data read out in a second sequence.

BRIEF DESCRIPTION OF THE DRAWINGS

FIGS. 4A–4E are a series of timing diagrams useful in explaining the operation of the invention.

DESCRIPTION OF THE PREFERRED EMBODIMENTS

Figure 1:
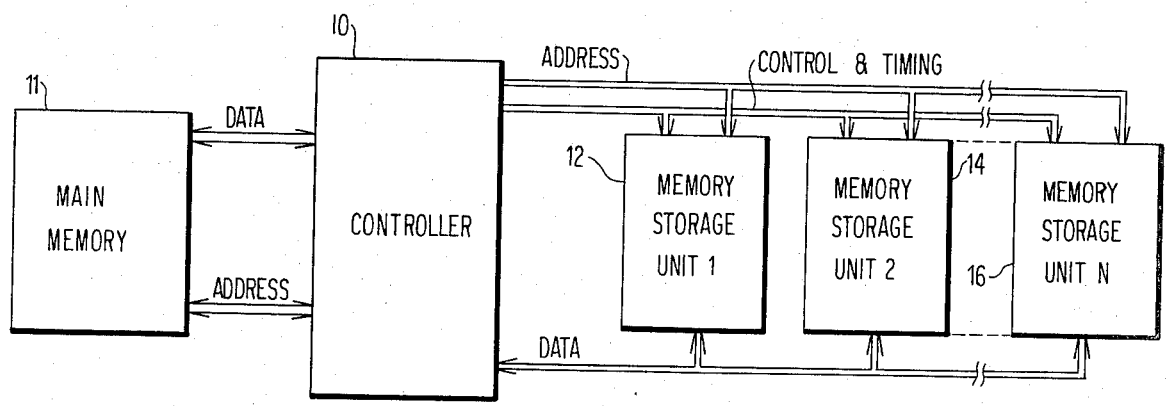
FIG. 1 is a generalized block schematic diagram of a computer memory system in which the present invention is used to advantage.

Referring first to FIG. 1, there is shown a generalized block diagram of a computer memory system having a page storing configuration in which the present invention can be used to particular advantage. In this system, controller 10 controls the transfer of blocks of digital data from memory storage units 12–16 to a system main memory 11. In the page storing type of memory system such as illustrated here, a block of data, which may, for example, comprise 4,096 bytes arranged in a preferred configuration such as 8×512 bytes, is stored in one or more of memory storage units 12–16. Each block of data can be stored solely within a single one of memory storage units 12–16, or as is the more common case, a portion of a block stored in one unit and another portion stored in another one of memory storage units 12–16.

When data is to be transferred out of memory storage units 12–16, the starting address is transferred to main memory 11, which may be a random access memory, through the address bus to controller 10. Controller 10 then modifies the address as required to correspond with the addressing scheme used with memory storage units 12–16, then outputs the correct address on its output address bus upon which all of memory storage units 12–16 are connected. The appropriate timing and control signals are also produced for controlling the readout operation. The data read out of memory storage units 12–16 passes out again through controller 10 upon the output data bus back to main memory 11. Main memory 11 is preferably a random access memory which may, in some embodiments, be the main random access memory of the entire computer system. In other embodiments, main memory 11 can be an assembly memory which is used as a buffer between the portion of the system shown in FIG. 1 and the remainder of the computer system or other data utilization means. Because main memory 11 is not required to perform operations or to further transfer the data until the entire block of data is assembled therein, it is not necessary to transfer the data in any fixed unmodifiable sequence such as serially from beginning to end.

Figure 2:
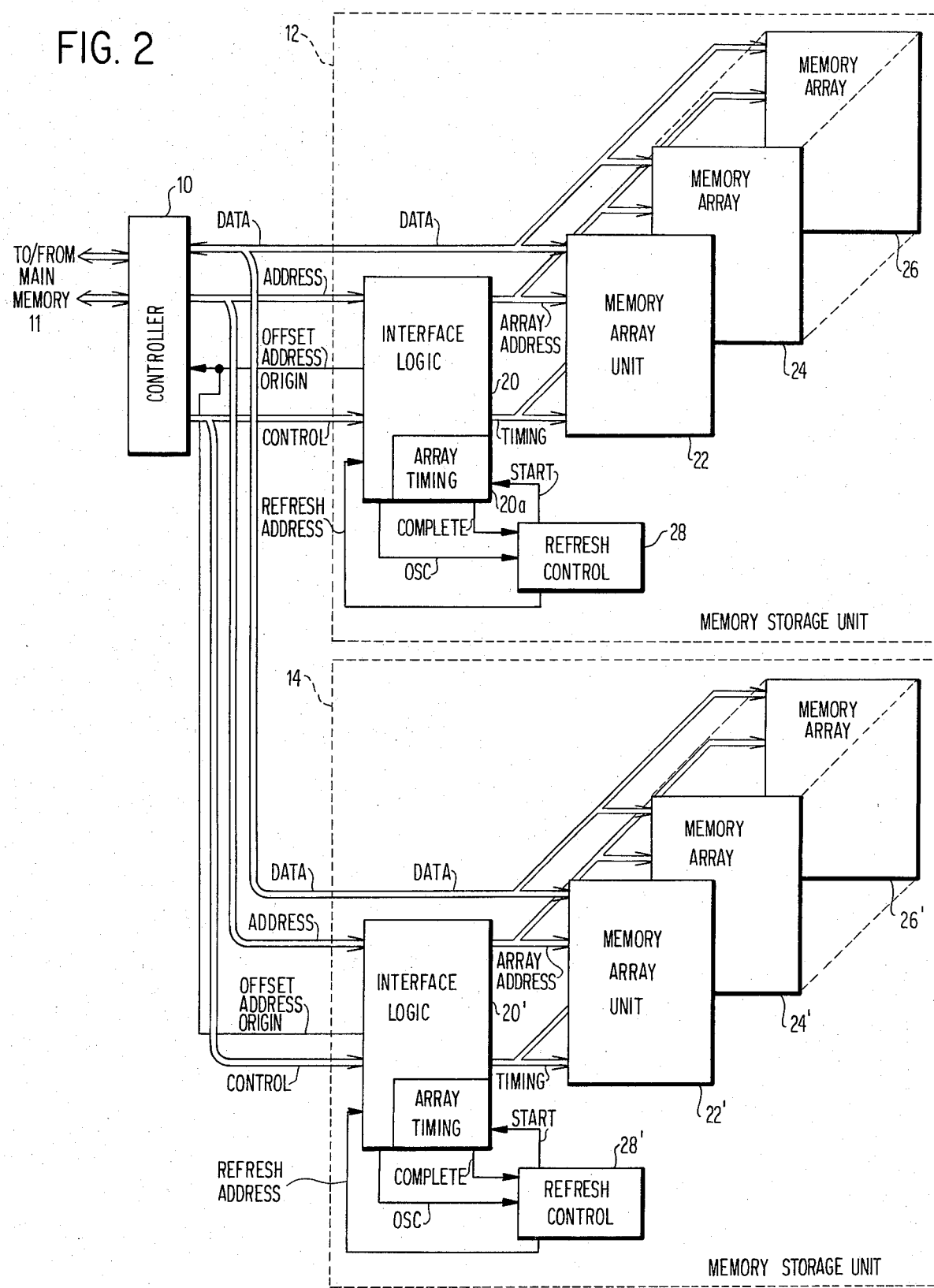
FIG. 2 is a detailed block diagram of a computer memory system in accordance with the present invention.

Referring now to FIG. 2, there is shown a more detailed diagram of the system shown in FIG. 1. Within each memory storage unit 12–16, there are arranged a number of memory array units 22–26, the number being unimportant with regard to the central concept of the invention as any number can be used depending upon the application required. Each memory array unit 22–26 receives data on a data bus directly from controller 10. Address signals are sent from controller 10 via interface logic 20 to the various address inputs of memory array units 22–26. Similarly, the control signals produced by controller 10 couple to the inputs of interface logic 20 which in turn produces timing signals for operation of each separate memory array unit 22–26. Within interface logic 20, array timing circuit 20a cooperates with external refresh control 28 to produce the requisite timing signals for both the reading in and reading out of data to and from memory array units 22–26 as well as for the necessary refresh operations.

In the preferred embodiment, each memory array unit 22–26 is a LARAM such as that described in referenced U.S. Pat. No. 4,024,512.

As memory array units 22–26 are constructed using CCD shift registers arranged in LARAM's, a refresh of each memory array unit 22–26 is required at predetermined time intervals so that the data stored in each individual shift register is recirculated and hence refreshed to prevent data loss.

Figure 3:
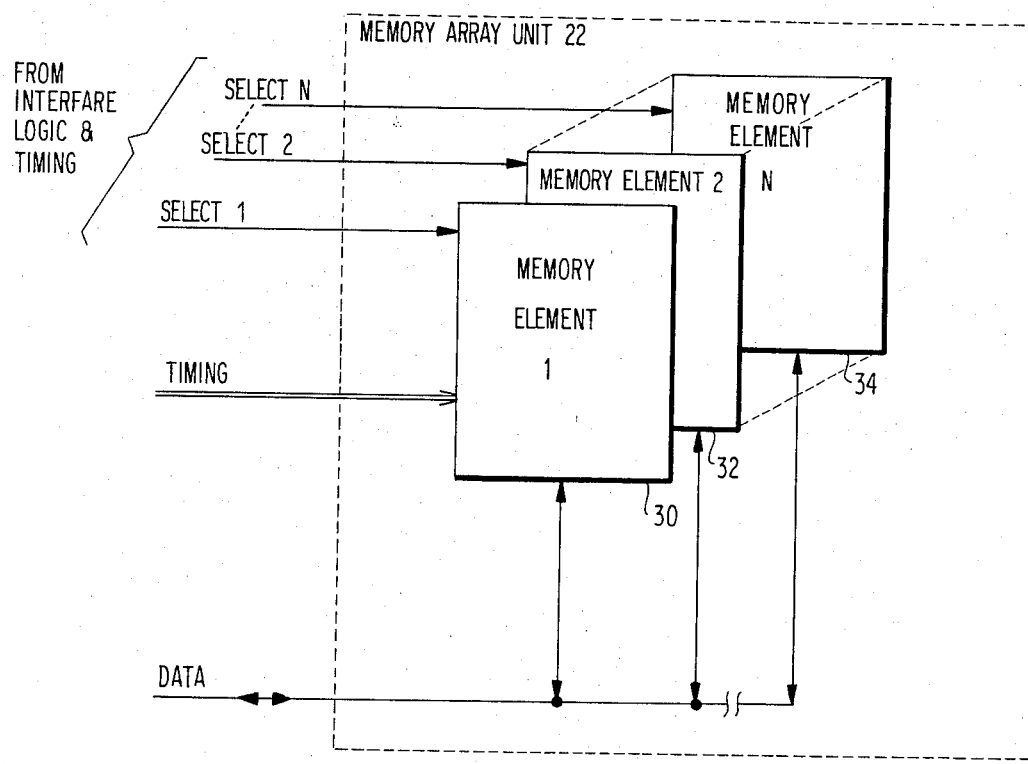
FIG. 3 is a block diagram of one of the memory array units used in the computer memory system of FIG. 2.

The internal structure of one of memory array units 22–26 is shown in simplified form in the view of FIG. 3. As shown, each memory array unit includes plural memory elements or segments 30–34 each of which is a shift register.

During the required refresh operation, SELECT LINES 1 through N are activated in sequence and the data read out of memory elements 30–34 as the corresponding select line is activated. The output data from each memory element 30–34 is read through a sense amplifier (not shown) and a feedback loop (not shown) to the corresponding data inputs. Clock signals for this operation are provided from interface logic 20 upon the timing bus which is connected to each of memory elements 30–34.

Referring back to FIG. 2, in accordance with one aspect of the invention, the beginning address of each block of data stored within memory storage unit 12 is set to begin at other than the beginning address within one of memory elements 30–34 so that during the readout operation, it is necessary to read data out from at least two separate memory elements. Preferably, the start address of a block of data is set to begin at approximately the mid-point of the addresses for one of the memory elements.

During the readout operation, the start address of the one or more blocks of data which are to be read out through controller 10 are communicated by controller 10 to interface logic 20 which translates the incoming address to the appropriate address for memory array units 22–26. If no refresh operation were required, data would begin to be read out from the address produced by interface logic 20 and continue on through contiguous memory elements in sequence until the desired amount data has been transmitted.

However, it may be expected that one or more of the memory elements will have to be refreshed during the readout operation so that the data stored therein will not be lost. If the readout operation were to proceed entirely in sequence, it would be necessary to stop and wait while a memory element was refreshed before the data readout operation could be recommenced. Because the refresh time so involved would be an appreciable percentage of the total readout time, it is desirable to eliminate it entirely from the total readout time period.

Thus, in accordance with the invention, a determination is made as to whether or not the next memory element in sequence from which data is to be read out requires a refresh during the subsequent readout time period. If a refresh operation is required, this memory element selection interval is reordered to a different selection sequence. This is possible since data must be transferred out of the memory storage unit in whole blocks and it makes no difference in what order the data within a block is transferred so long as the data is placed in the correct location in proper sequence within main memory 11.

To accomplish this, the address generation circuitry of controller 10 is constructed of a recycling binary counter, the start count of which may be set to correspond to the appropriate memory element when the OFFSET ADDRESS ORIGIN signal is in the active state.

Figure 5:
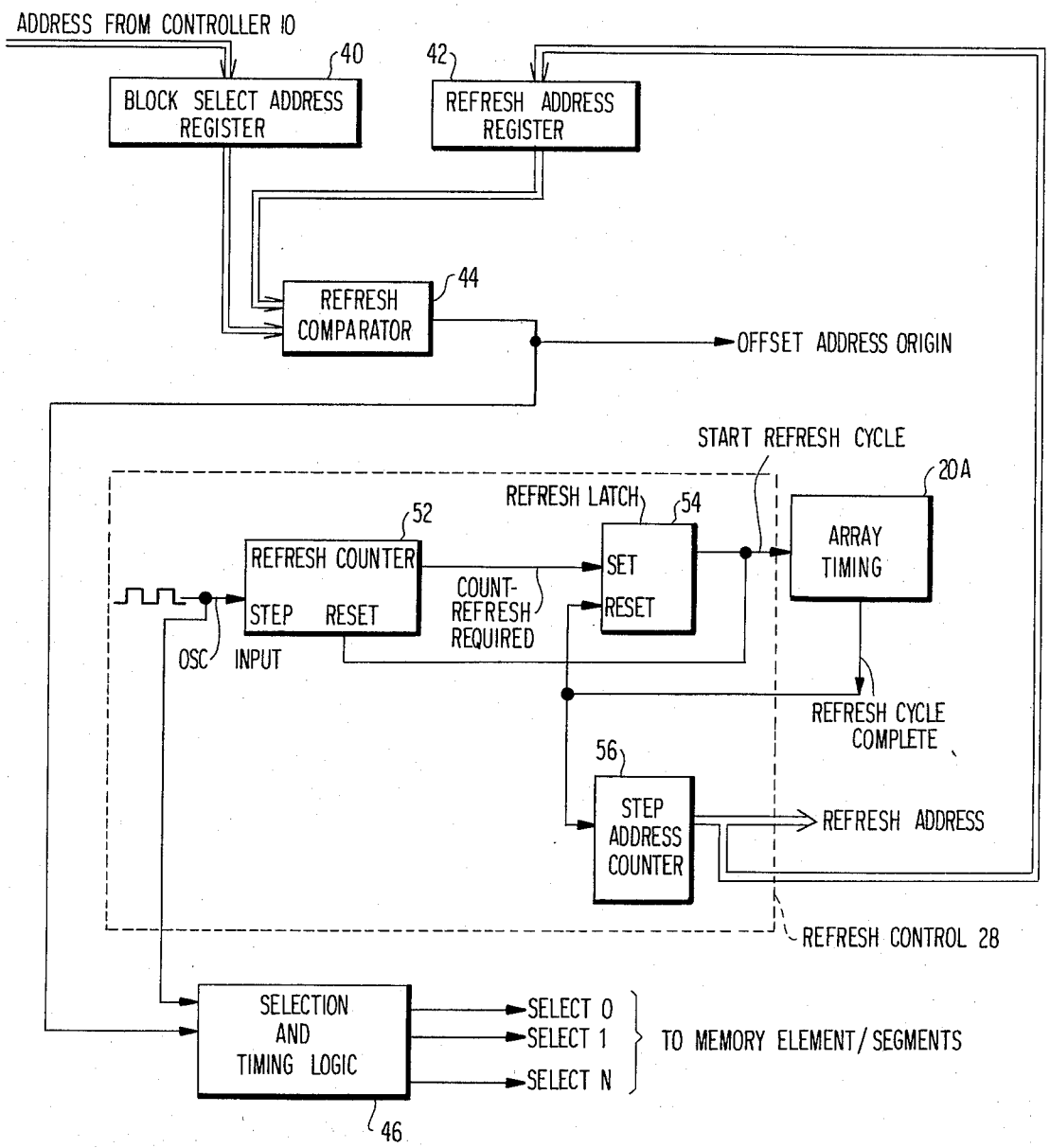
FIG. 5 is a detailed block diagram of a portion of the interface logic, array timing and refresh control circuits of FIG. 2.

Interface logic 20 detects when a refresh will be required during the next subsequent readout time period, as will be shown and discussed in conjunction with FIG. 5. When a requirement for refresh is detected, an OFFSET ADDRESS ORIGIN signal is produced by interface logic 20 which is coupled to controller 10. Controller 10, instead of producing the next address in sequence which would correspond to the memory element being refreshed, produces a reordered address sequence. This reordering results in starting with a memory element which was to be selected at a different interval, namely, the memory element which had a refresh required. This enables the memory element requiring refresh to transfer data prior to the refresh interval and then complete the refresh while another element is selected for data transfer. Alternatively, when the first memory element in sequence has the refresh, it is initially skipped and transfers its data at the end of the sequence interval.

Referring next to FIG. 5, there is shown a block schematic diagram of a portion of interface logic 20, array timing 20a and refresh control circuit 28 of memory storage unit 12 from FIG. 2. The incoming address from controller 10 is stored in block address register 40. The address, produced by refresh control circuit 28, corresponding to the memory element next to be refreshed is stored in refresh address register 42. A comparison between the outputs of registers 40 and 42 is made by refresh comparator 44. If the two digital values are equal, corresponding to the case when the address of the next memory element to be refreshed is the same as the memory element from which data would normally be read, the output of refresh comparator 44 assumes the active state, thereby producing the OFFSET ADDRESS ORIGIN signal. This signal causes controller 10 to change the output address so as to unload data from the next memory element in sequence or another memory element as preferred. Afterwards, the OFFSET ADDRESS ORIGIN signal again assumes the inactive state.

Within refresh control circuit 28, refresh counter 52 produces output pulses at predetermined intervals corresponding to the refresh time of memory elements 22-26. The output pulses from refresh counter 52 set refresh latch 54 in the active state which then activates array timing circuit 20a. The output of refresh latch 54 also resets counter 52.

Array timing 20a is a timer circuit which starts marking time upon receipt of the start refresh cycle pulse produced at the output of refresh latch 54 and produces a refresh cycle complete pulse on its output after the time period corresponding to the refresh time required for each of the memory elements. The output pulses from array timing 20a advance step address counter 56 by one pulse for each count. The output of step address counter 56 then corresponds to the memory element being refreshed.

Selection and timing logic 46 is provided for producing activating signals upon the SELECT O through SELECT N lines which connect to each of memory elements 30-34. Only one of these is activated at any one time. For this purpose, selection and timing logic 46 may include a recirculating shift register in which only a single one of the register outputs is in the active state at any one time. Advancement of selection and timing logic 46 occurs with the same oscillator input as is used with refresh counter 52. When the OFFSET ADDRESS ORIGIN signal is in the active state, selection and timing logic 46 is reset so that the SELECT ZERO line is activated.

Referring next to the timing diagrams shown in FIGS. 4A-4E, the timing of the system of the invention will be explained in more detail. FIG. 4A represents the total readout time which would be required if the present invention were not used. First, a refresh time interval $t_0-t_1$ is required for refreshing one of those memory elements. Next, a data transfer interval of $t_1-t_2$ is necessary for the readout of a single block of data. Without the refresh interval, the time for unloading a single block of data is $t_0-t_N$ as shown in FIG. 4B.

Again, without the use of the invention as illustrated in FIG. 4C, if a refresh interval is required during the block transfer time, it is necessary to halt the block transfer operation for a refresh interval of $t'_0-t'_1$, thereby increasing the total readout time for a block of data to $t'_N$.

FIG. 4D shows the distribution of data among plural memory elements where $t_0, t_1, \ldots t_N$ represent the readout times for the corresponding memory elements with no refresh encountered. If a refresh is required during the selection time corresponding to $t_0$, for example, the readout sequence is shown in FIG. 4E. The readout operation commences with the memory corresponding to $t_1$ and continues on in sequence through $t_N$ then returns to $t_0$. The same sequence may be followed for a refresh in $t_1$ through $t_N$.

This completes the description of the preferred embodiments of the invention. Although preferred embodiments of the invention have been described, it is believed that numerous modifications and alterations thereto would be apparent to one having ordinary skill in the art without departing from the spirit and scope of the invention.

What is claimed is:

1. A computer system storage memory comprising in combination:
   (a) a plurality of ordered memory array units, each of said memory array units storing a plurality of bits of data within ordered memory elements, each of said memory elements requiring refresh within a predetermined time interval;
   (b) means for refreshing said memory elements in a predetermined fixed sequence so as to refresh each of said memory elements within said predetermined time interval; and
   (c) means for reordering a memory array selection sequence and reading out the data stored in said memory array units without an increase in readout time due to refreshing of said memory elements.

2. The combination of claim 1 wherein said means for reordering and reading-out comprises:
   (a) means for determining whether a refresh operation is to be performed on a first memory element during the time period during which the next readout operation is to be performed; and
   (b) means for reading out data from a second memory element while said first memory array unit is being refreshed.

3. The combination of claim 2 wherein said means for the reordering and reading-out further comprises means for reading out data from said first memory element after data has been read out from said secondary memory element.

4. The combination of claim 3 wherein each of said memory elements comprises at least one shift register.

5. The combination of claim 4 wherein each shift register comprises a CCD shift register.

6. The combination of claim 3 wherein each of said memory array units comprises a dynamic random access memory.

7. The combination of claim 3 wherein each of said memory array units comprises a LARAM.

8. A computer system storage memory system comprising in combination:
   (a) a plurality of ordered memory array units, each of said memory array units storing a plurality of bits of data within ordered memory elements, each of said memory elements requiring refresh within a predetermined time interval;
   (b) means for refreshing said memory elements in a predetermined fixed sequence so as to refresh each of said memory elements within said predetermined time interval;
   (c) means for storing addresses, each of which represents a memory element from which data is to be read out;
   (d) means for producing a sequence of digital numbers, each of which represents a memory element to be refreshed;
   (e) means for comparing said addresses and the numbers of said sequence of numbers to produce a control signal which is in an active state when the address and said numbers of said sequence both represent the same memory element; and
   (f) means for producing said addresses, each of which designates one of said memory elements from which data is to be read out, said addresses being produced in a predetermined first order when said control signal is in the inactive state and in a predetermined second order when said control signal is in the active state.

9. The combination of claim 8 wherein said addresses are produced in the order corresponding to the ordering of said memory elements when said control signal is in the inactive state.

10. The combination of claim 9 wherein, when said control signal is in the active state, the address corresponding to the memory element then to be refreshed is reordered with the sequence and the next address in said sequence is produced.

11. The combination of claim 10 wherein said address which was omitted is produced after said next address.

12. The combination of claim 8 wherein each of said memory array units comprises at least one shift register.

13. The combination of claim 12 wherein each shift register comprises a CCD shift register.

14. The combination of claim 13 wherein said memory array units each comprise a dynamic random access memory.

15. The combination of claim 13 wherein said memory array units each comprise a LARAM.

16. A computer memory system comprising in combination:
   (a) a first memory for storing simultaneously a block of data of predetermined size;
   (b) a second memory for storing simultaneously a plurality of blocks of data of said predetermined size, said second memory comprising a plurality of memory storage units each comprising a plurality of memory array units, each having a plurality of memory elements, each of said memory array units requiring refresh within a predetermined time interval; and
   (c) means for transferring data from said second memory to said first memory comprising means for reordering a memory array selection sequence and reading out of said memory array units without an increase in readout time due to refreshing of said memory elements.

17. The combination of claim 16 wherein said means for reordering a memory array selection sequence and reading-out comprises:
   (a) means for determining whether a memory element is to be refreshed during a predetermined time interval; and
   (b) means for reading out data from said memory elements in a predetermined sequence until a memory element is encountered which is to be refreshed during the next subsequent predetermined time interval at which time data from another memory element within the same memory storage unit is read out.

18. The combination of claim 17 wherein said another memory element is the next memory element in sequence.

19. The combination of claim 18 wherein the data from said memory array unit which was refreshed is read out after the data is read out from said next memory array unit in sequence.

20. The combination of claim 19 wherein each of said memory array units comprises a dynamic random access memory.

21. The combination of claim 19 wherein each of said memory array units comprises a plurality of LARAM's.

22. The combination of claim 21 wherein each of said LARAM's comprises a plurality of shift registers.

23. The combination of claim 22 wherein each of said shift registers are CCD shift registers.

24. A method for transferring blocks of data of predetermined size to a first memory from a second memory having a plurality of memory elements which are refreshed at predetermined time intervals, comprising the steps of:
   (a) reading data out of said memory elements in a predetermined sequence;
   (b) while simultaneously determining whether the next memory element in sequence is to be refreshed during the next subsequent readout time interval;
   (c) skipping reading out data from a memory element which is to be refreshed during said time interval;
   (d) reading out data from another memory element during said time interval; and
   (e) reading data out from the skipped memory element during an interval when refresh is not required.

25. The method of claim 24 wherein said memory array units each comprise a LARAM.

26. The method of claim 25 wherein each LARAM comprises a plurality of CCD shift registers.

27. The method of claim 24 wherein said memory array units each comprise a dynamic random access memory.

* * * * *